United States Patent [19]

Gieles

[11] 4,131,524

[45] Dec. 26, 1978

[54] MANUFACTURE OF SEMICONDUCTOR DEVICES

[75] Inventor: Antonous C. M. Gieles, Eindhoven, Netherlands

[73] Assignee: U.S. Philips Corporation, New York, N.Y.

[21] Appl. No.: 167,504

[22] Filed: Jul. 29, 1971

Related U.S. Application Data

[62] Division of Ser. No. 879,171, Nov. 24, 1969, abandoned.

[51] Int. Cl.² ............................................. C25F 3/12
[52] U.S. Cl. ................................. 204/129.3; 219/69 R
[58] Field of Search ............. 204/129.3, 129.1, 129.65

[56] References Cited

U.S. PATENT DOCUMENTS

| 2,994,811 | 8/1961 | Senitzky | 204/129.3 |
| 3,230,763 | 1/1966 | Frantzis | 317/235 |
| 3,492,513 | 1/1970 | Hollander et al. | 317/235 |
| 3,616,345 | 10/1971 | Van Dijk | 204/129.3 |
| 3,616,348 | 10/1971 | Greig | 204/129.3 |

Primary Examiner—T. Tung
Attorney, Agent, or Firm—Frank R. Trifari

[57] ABSTRACT

A method of manufacturing a semiconductor device comprising the steps of providing a plate-shaped semiconductor body, removing by spark erosion a first portion of the semiconductor body, and then using a selective etching process to remove only a second portion of the semiconductor body.

1 Claim, 10 Drawing Figures

MANUFACTURE OF SEMICONDUCTOR DEVICES

The invention relates to a method of manufacturing semiconductor devices comprising adjacent parts of different thicknesses and to semiconductor devices thus made. There has been proposed a semiconductor device consisting of a thin, plate-shaped part with a thickened rim for a target plate in a vidicon camera tube. The manufacture of such a plate-shaped body involves the difficulty of removing the material from a thicker plate to an extent such that a thin portion of uniform thickness is left. In Dutch Patent Application 6,703,013 a method is disclosed for etching away the material by using a selective, electrolytic etching process from disc-shaped bodies of a thickness of a few hundred microns provided with a layer of a different conductivity type and/or a different conductivity, for example, having a thickness of the order of $10\mu$, to an extent such that only the thin applied layer of the different conductivity and/or conductivity type is left. It is furthermore disclosed that by means of said method a silicon target plate for use in a vidicon camera can be manufactured. The invention is partly based on the recognition of the fact that in this method a thicker rim can be maintained by covering said rim by a suitable etching-resistant material.

With such a silicon target plate of a vidicon the lateral dimensions are comparatively large, for example, of the order of a few centimeters.

A further recognition having led to the present invention is that it may be desirable for various uses to alternate thin, flat semiconductor parts of small lateral dimensions or to surround them with parts of greater thickness, for example, for reasons of rigidity, as for pressure-sensitive semiconductor devices. It will frequently suffice to use a pattern of an etch-resistant masking material on the side where the material has to be etched away, for example applied by photographic means using a photo-resist, the assembly being subsequently subjected to the selective electrolytic etching process. However, since the etching effect also applies to lateral directions with approximately the same rate as in the direction of depth, it is difficult to obtain accurate lateral boundaries between thicker and thinner parts. It is difficult, in particular, to obtain in an accurate and reproducible manner thin parts of comparatively small dimensions, for example, of the order of 1 mm$^2$ or smaller, surrounded by thicker parts. An object of the present invention is inter alia to provide a method which permits of achieving such configurations. According to the invention a method of manufacturing semiconductor devices having juxtaposed parts, at least one of which is thicker than at least one adjacent part, is characterized in that a plate-shaped substrate of semiconductor material is provided on one side with a layer of semiconductor material of a different conductivity type and/or a different conductivity, subsequently the semiconductor material of the substrate is locally removed from the side opposite the layer concerned to a depth located in the proximity of the boundary of the substrate with the said layer, however, without transgression of said boundary, after which with the aid of a selective electrolytic etching process the thinner parts are etched down to the said boundary.

In principle the local removal might be carried out by mechanical means, for example, drilling, grinding or the like. However, it is then necessary to consider that disturbances of the crystal lattice may occur, which promote the attack by the electrolytic etching process. It has therefore to be taken into account that the recesses obtained are likely to widen and deepen rapidly in the electrolytic etching process. If the material disturbances should also penetrate into the provided layer of the different conductivity type, the material of said layer would also be etched away. In a preferred embodiment the semiconductor material is locally removed by spark erosion. Such a process has the advantage that when carried out in normal manner in a dielectric liquid the lateral dimensions of the recesses will not change substantially by the spark erosion when the recess is further deepened. The electrodes for the spark erosion may be shaped in the required form for the part to be removed, for example, a cylindrical form taking into account a removal of the material over a distance of a few microns, for example, 5 microns. During erosion such an electrode can be moved gradually further into the recess formed.

As an alternative a local, electrolytic etching process may be used for local removal of the substrate, for example, with a localised field with the aid of a cathode in an insulating capillary. With a progressing depth of the recess which is being formed said capillary can be moved gradually further into said recess. Although the lateral shape of the recess, made in this manner, is not as accurate as in the case of using spark erosion, said localised-field etching has the advantage that the junction with the provided layer may be used for counteracting further etching. If the etching process is automatically stopped in said manner, the local removal and the selective electrolytic etching process may be carried out in one and the same operation. However, if, for example, due to a strong local field produced in local electrolytic etching the transition to the layer of the different conductivity and/or conductivity type should no longer be capable of retaining the anodic etching process, it is possible to change over to the use of a normal cathode at a given distance from the semiconductor body to be etched just before the provided layer is reached. In principle, this might be achieved in the same bath by which the local etching process is carried out.

Preferably in the method according to the invention a single-crystal body particularly a silicon body. The said layer having a conductivity and/or conductivity type differing from that of the substrate material is preferably deposited epitaxially on the substrate.

For the selective etching process of a substrate consisting of p-type silicon or low-ohmic n-type silicon and an epitaxial layer of high-ohmic n-type silicon may be used. It is furthermore possible to use low-ohmic n-type silicon for the substrate and to deposit p-type silicon epitaxially for forming the layer so that at the transition to the substrate material a thin layer of n-type silicon is formed, which is sufficient to arrest the selective electrolytic etching process. If subsequent to the etching process this thin n-type conducting layer has to be removed, a brief chemical etching process may be used.

In the case of a silicon substrate it is preferred to use a fluorine-containing bath in the selective electrolytic etching process. It is furthermore not necessary in the etching process, in which an anodic connection to the substrate material is used to apply a counter-voltage to the material of the other conductivity and/or conductivity type. In the above-mentioned particular cases it has been found that passivation of the surface exposed to the electrolyte may occur at the transition to the layer of different conductivity and/or conductivity type.

In the layer of different conductivity and/or conductivity type, particularly in such a layer deposited epitaxially, local zones of a different conductivity or conductivity type than that of the epitaxial material may be formed, for example, by diffusion. If these zones are sufficiently remote from the transition to the substrate, these zones may be maintained during the electrolytic etching process.

In principle it is possible to diffuse into said layer for example low-ohmic n-type material or p-type material, the depth being such that locally the deposited layer is etched right across. This may be used, for example, for obtaining thin flat bending springs spaced apart from each other by interstices for purposes mentioned later-on or flexible strips for other uses. It may furthermore be used for the relative insulation of parts of an integrated circuit. As an alternative, prior to or after the local removal of the substrate material by means of the electrolytic etching process these recesses may be provided in the layer provided, for example by locally etching using an etch-resistant mask. These recesses may have a depth equal to the layer thickness or somewhat more, thus preventing substantial underetching.

In order to provide local diffusion regions and contacts known planar techniques may be employed. It is preferred to carry out these planar techniques prior to the local removal of the substrate material, although one or more of these processes may also be carried out afterwards.

Subsequent to the electrolytic etching process, which provides thin semiconductor parts of uniform thickness, a further chemical etching may be carried out, for example, for obtaining a desirable, smaller thickness, for etching away the material located at the transition between the substrate material and the layer provided, or for obtaining zones of a different conductivity type and/or conduction, formed by diffusion from the other side. In this way so-called flat-land structures may be obtained, in which pn-junctions extend transversely of the semiconductor surface from one side of the thin part to the other side.

The method according to the invention is particularly important for the manufacture of semiconductor devices for converting mechanical stresses into electric signals, in which one or more flat bending springs of semiconductor material, for example, a semiconductor diaphragm, are provided. For such devices it is particularly important to have a method of manufacturing a flat semiconductor spring of small by uniform thickness. Further the method according to the invention provides for an easy and accurate way for obtaining a thickened supporting rim for the flat thin bending spring or springs, for instance in the form of a diaphragm at its perephery attached to said rim. The thickened rim can provide for the mechanical rigidity and avoid stress variations due to temperature fluctuations.

Semiconductor devices for converting mechanical stress into electric signals may be employed for various purposes, for example, for measuring pressures in gases or liquids, for converting acoustic oscillations into electric signals, for example, in microphones, in accelerometers, for example in airplanes, for registering mechanical stress in construction materials and the like.

It is known to use for such purposes flat bending springs, for example, in the form of a diaphragm suitable for measuring pressure. Particularly for measuring pressures of liquids, for example, for medical or veterinary purposes as blood pressure meter it has been proposed to use a silicon diaphragm clamped tight at the periphery in a frame or stuck to a frame. The semiconductor diaphragm comprises one or more circuit elements sensitive to mechanical stresses in the diaphragm, for example, so-called strain gauges, provided with contacts for deriving electric signals from such a voltage sensitive circuit element. Particularly by using planar techniques semiconductor devices of the kind set forth may be constructed with comparatively small dimensions. The voltage sensitive circuit elements formed by strain gauges may be intercoupled in a Wheatstone bridge arrangement. It is thus possible to compensate for resistance variations solely due to temperature fluctuations.

Articles in periodicals dealing with the influence of mechanical stresses and the deformations involved on the electrical properties of semiconductors and with possible applications thereof are found for example in "Journal of Applied Physics", 32, 10 (1961-10), pages 2008 to 2019 and 33, 11 (1962-11) pages 3322 to 3327, "Zeitschrift fur angewandte Physik" 17, 7(1964), pages 511 to 517 and "Electronic Design" 16 (1967-08-02) under the heading "News", pages 22 to 26.

A difficulty resides in that in assembling such a pressure-sensitive device the diaphragm must not be too thin in order to be manipulated satisfactorily; it must for example not be thinner than 50μ. In order to attain a high pressure-sensitivity in spite thereof, the diaphragm should have a sufficiently large diameter. As is known the pressure-sensitivity is proportional to the square of the ratio between the diameter and the thickness of the diaphragm. A further difficulty is that temperature fluctuations in the clamped diaphragm may give rise to varying mechanical stresses due to a difference in expansion coefficients of the material by which the diaphragm is clamped tight and the silicon. The method according to the invention enables inter alia to avoid the aforesaid disadvantages, as it is especially suitable for manufacturing a semiconductor device for converting mechanical stresses into electric signals, said device comprising at least one flat bending spring of semiconductor material having at least one circuit element, which is sensitive to mechanical stresses in the bending spring and is provided with contacts for deriving electric signals from the voltage-sensitive circuit element, said semiconductor device comprising a thickened supporting rim for the flat bending spring(s), which rim consists of the same semiconductor material as integral with the semiconductor material of the spring(s). The thickened rim provides the required rigidity for the thin semiconductor springs so that inside the rim these springs may be very thin and may even have a thickness of less than 50μ, preferably of not more than 30μ. It is possible to manufacture for such a flat bending spring with very small lateral dimensions, which obtaining a sufficiently high sensitivity to mechanical stresses. The thickened rim may be clamped tight or be stuck to a support without the mechanical stresses involved being transferred to the bending spring.

It is preferred to use a single-crystal semiconductor material for manufacturing the flat bending spring(s) and the associated supporting rim; such a bending spring is preferably made of a layer of epitaxially deposited material, the thickened supporting rim being partly made of the initial single-crystal substrate material on which the epitaxial layer is deposited. Epitaxial material has the advantage that it does not include so-called striations, which may often occur in a single crystal formed from a melt. Such so-called "striations" are thin zones of enhanced doping concentrations lying in growth planes and being capable of causing locally different properties of the semiconductor material, for example, non-uniform penetration depths and concentrations of impurities, for example, in diffused regions. In general these differences may be troublesome, but this particularly applies to semiconductor devices for converting mechanical stresses into electric signals.

Silicon is a particularly appropriate semiconductor material. By using planar techniques circuit elements sensitive to mechanical stresses can readily be provided in silicon locally. Said circuit elements may be combined with other circuit elements to form an integrated circuit. It is preferred to provide oxide layers on both sides of the flat bending spring in order to compensate for stress due to the difference in expansions of the semiconductor material and the oxide. In such an oxide film windows may be provided in known manner, while contact strips may be provided on the oxide film leading to these windows.

It should be noted that the known pressure-sensitive semiconductor devices have a difficulty in that electrical connections to the semiconductor diaphragm have to be used, which connections are liable to change the stresses in the diaphragm in an uncontrollable and non-reproducible manner. In the present case, however, that semiconductor device is provided with a thickened supporting rim to which the connections may be attached. The connections fastened to the rim will then substantially not affect the stresses in the flat bending spring itself.

Stress variations in the flat bending spring may be converted into electric signals by various circuit elements, for example, diodes and devices having more than one pn-junction. Stress variations are preferably measured by means of stress-dependent resistances in the semiconductor material. For this purpose it is preferred to use narrow regions obtained, for example, by diffusion, each of them being provided at its end with contacts. Such a region, which may also be termed "strain gauge" is preferably located on one side of a flatbending spring. By deforming the bending spring due to external forces, such as a pressure difference on either side of a bending spring having the form of a diaphragm, local flexures occur in the diaphragm. As a result the material on one side of the diaphragm is extended in a given direction, whereas it is compressed on the other side of the diaphragm. Viewed from the direction of the lower pressure, the diaphragm portions at the rigidly fastened rim will in general be concave and convex at the centre. Somewhere between the centre and the rim the material will not be bent substantially. By using partly strain gauges near the centre and partly strain gauges at the rim on one side of the diaphragm, it is possible to measure, for example, by means of a Wheatstone bridge circuit, resistance variations due to mechanical stresses in the diaphragm.

In general p-type resistances in silicon are more dependent upon mechanical stresses than are n-type resistances. Therefore it is preferred to use flat bending springs of n-type material and diffused strain gauges of p-type material. In principle, it is of course also possible to use an n-type strain gauge obtained, for example, by diffusion in material of p-type conductivity.

The sensitivity of strain gauges may depend upon the selected crystallographic direction. When using strain gauges of p-type in silicon it has been found that this sensitivity to directions lying in a {111}-plane is practically isotropic. On the contrary the resistance of p-type material in a <100> direction is substantially insensitive to mechanical stresses, whereas in a <110> direction the resistance of p-type material is highly sensitive to mechanical stresses. If the silicon diaphragm has flat sides in the (110) planes, the [1$\bar{1}$0] and the [001] directions in such a plane are at right angles to each other. This may be advantageously used by appropriately combining p-type strain gauges in these two directions, for example, in accordance with a Wheatstone bridge circuit. This has the advantage that the strain gauges may be arranged immediately near each other, so that the temperatures of the resistance gauges are less likely to differ. A suitable configuration of such a Wheatstone bridge is given by the disposition of the gauges in a square with contacts arranged at the corners.

The flat bending spring may be given the form of a diaphragm, which is bounded at its periphery by the supporting rim. Thus the device may be made suitable for pressure measurement. Since the diaphragm may be given a very small thickness, the diameter of the diaphragm may also be made small, for example, smaller than 3 mms, preferably not more than 2 mms, the supporting rim then being given an outer diameter of less than 5 mms, preferably not more than 3 mms. The device thus made is therefore particularly suitable for pressure meters, having very small sizes, for example, for measuring blood pressure, it being even possible to provide a very small construction suitable for introduction into blood vessels. The diaphragm in such a pressure meter may form the closed wall of a box, the further walls of which are connected with the thickened rim of the diaphragm. Pressure differences on either side of the diaphragm can thus be measured, for example, when the atmospheric pressure prevails inside the box and the box is located in the medium whose pressure has to be measured.

In a further preferred application the semiconductor device may be provided with a further thickened part inside the rim, in this case termed a thickened central part, which is connected via the bending spring(s) with the rim. This part may have the form of a ring or a disc and is preferably accommodated symmetrically inside the supporting rim. A displacement of the thicker inner part with respect to the rim in directions at right angles to the plane of the bending spring(s) are capable of producing stresses in the bending spring(s), which may be measured by means of the voltage sensitive circuit elements. A bending spring may be employed, which forms a closed diaphragm between the central part and the rim, but as an alternative a few strip. shaped bending springs may be disposed radially between the central part and the rim. Such a device may be used, for example, as an accelerometer, in which one of the two thickened parts is connected with the object whose acceleration is being measured, whereas the other thickened part is used as an inertial mass or conversely. In the latter case the connections are preferably secured to the central part. A further possibility of use may reside in the recording of mechanical stresses or in measuring other values based on a relative displacement of the two thickened parts.

The method according to the invention furthermore permits of manufacturing semiconductor devices, for example, integrated circuits, in which semiconductor circuit elements or groups of circuit elements are accommodated in separate, thin, adjacent parts of semiconductor material, which are interconnected by insulating material and/or conductive connecting strips, which in turn are arranged in common in a semiconductor frame of thicker material. The thin semiconductor parts may be suspended flexibly to the thicker frame of semiconductor material. In this way an assembly may be obtained, which may be manipulated mechanically in a satisfactory manner, whilst the individual thinner semiconductor elements owing to their flexible suspension are not charged by external mechanical stresses. It is, for example, not necessary to use as conductive bridges such thick conductors as in the semiconductor techniques of so-called beam leads, since owing to their small thickness the separate semiconductor parts have a very light weight. Such conductive connecting strips may even be reinforced by insulating material. As an alternative, insulating bridges, which may be provided with conductors for their relative contacts, or even a flexible insulating sheet with such conductive connections may be used, which sheet is located between the semiconductor parts or on which sheet these semiconductor parts are arranged, said sheet being stressed within or on the thicker semiconductor frame. With such structures having thicker and thinner parts the advantage is further obtained that the thicker parts may be employed for attaching connections to the semiconductor devices.

The invention will be described more fully with reference to the accompanying drawings.

FIG. 8 is a cross sectional view thereof,

FIG. 6 is a plan view and

FIG. 7 is a bottom view of part of this semiconductor device.

Figure 1:
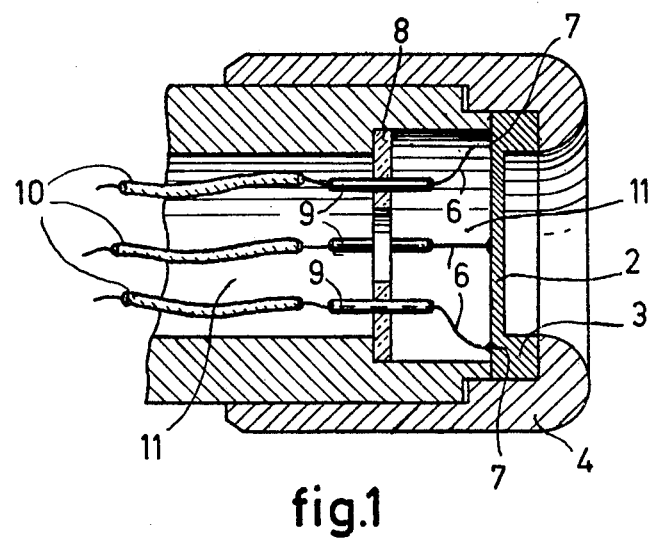
FIG. 1 shows schematically the head of a device for measuring the pressure in a liquid or a gas.

The device for measuring pressure in a liquid or a gas, the heat of which is shown in FIG. 1, comprises a tubular body 1 of conductive material, for example, stainless steel, to which a flexible duct for example of plastics or rubber (not shown) can be fastened. A semiconductor device for converting mechanical stresses into electric signals is in fact formed in a single semiconductor body consisting of a flat bending spring formed by a semiconductor diaphragm 2 and a thickened supporting rim 3. The semiconductor device is clamped by said rim at the end of the tubular body 1 with the aid of a metal tubular body 4, which is secured to the tubular body 1, for example, by welding. Between the metal of the tubular bodies 1 and 4 and the thickened rim 3 of the semiconductor body a preferably flexible intermediate layer may be used (not shown) which may consist of an appropriate soldering material. By its rim 3 the semiconductor body may be electrically connected to the tubular part 1, which may be provided on its inner side with an earthed contact (not shown).

The diaphragm 2 is provided with stress-dependent resistances arranged in a Wheatstone bridge circuit and connected through conductive paths to connecting places of the supporting rim 3, which will be described more fully with reference to FIGS. 2 and 3. Connecting wires 6 are electrically connected at these connecting places to the Wheatstone bridge circuit, for example, by using soldering balls 7 (not shown in FIG. 3). A stop on the inner side of the tubular body 1 is provided with an annular, insulating disc 8 provided with electrical through-connections 9. To one end of these electrical through-connections the wires 6 are connected, whereas the other end is connected to current supply wires 10 having an insulating sheath, through which voltage can be applied to and a measuring voltage can be derived from the Wheatstone bridge. The head of the voltmeter comprises a space 11, bounded by the inner wall of the tubular body 1 and the diaphragm 2. The space 11 may communicate through the said flexible tube with a space in which a known pressure prevails, for example, the open air. The head can be arranged in the gas or the liquid, the pressure of which has to be measured and owing to the pressure difference on either side of the diaphragm the latter is deformed so that a voltage appears across the voltage-dependent resistors. The head of the voltmeter is shown in FIG. 1 on a strongly exaggerated scale: in fact the diameter of the annular body 4 is about 2 mms and the diameter of the diaphragm 2 inside the supporting rim 3 is 1 mm.

The semiconductor device comprising the diaphragm 2 of semiconductor material and the thickened supporting rim 3 will now be described more fully with reference to FIGS. 2 and 3.

The supporting rim 3 consists of a single-crystal silicon substrate of the n-type having a resistivity of 0.01 Ohm.cm provided with an epitaxial layer 21, which extends throughout the diaphragm 2. It consists of n-type silicon having a resistivity of 0.6 Ohm.cm. The rim 3 has an inner diameter of 1 mm, an outer diameter of 1.4 mms and a thickness of 250$\mu$, whereas the diaphragm 2 has a thickness of 15$\mu$.

The diaphragm comprises on one side p-type conducting regions 22, 23, 24 and 25 provided with the aid of local boron diffusion. The thickness of these p-type regions is made 1$\mu$ and the sheet resistance is made 100 Ohm per square. These four regions have the same shapes and sizes and are formed by narrow strips 26, 27, 28, 29 respectively of a length of 100$\mu$ and a width of about 15$\mu$, the two ends of each narrow strip having broad parts for arranging contacts. On the side of the p-type regions 22, 23, 24 and 25 the semiconductor diaphragm is covered with an oxide layer 30, whereas such an oxide layer is provided on the opposite side of the diaphragm in order to compensate for stresses in the diaphragm due to the difference between the expansion coefficients of the silicon and the oxide. This second oxide layer 31 is prolonged beyond the thickened rim 3 up to the side where the oxide layer 30 is arranged. In the oxide layer 30 windows 32 are made for providing contacts at the end parts of the p-type regions. The oxide layer 30 is prolonged only partly across the surface of the rim 3 so than an annular part 41 of a semiconductor surface is not covered with oxide. This free surface part 41 may be employed for establishing an ohmic connection to the tubular metal part 1, one end face of which bears, if necessary with the interposition of a metal piece, on the annular surface part 41 (see FIG. 1). The windows 32 (see FIGS. 2 and 3) accommodate applied ohmic aluminum contacts i.e. the contacts 33 and 34 with the widened ends of the p-type zone 22, the contacts 35 and 36 with the widened ends of the p-type zone 23, the contacts 37 and 38 with the widened ends of the zone 24 and the contacts 39 and 40 with the windened ends of the zone 25. The surface of the oxide layer 30 is furthermore provided with current conductors formed by metal strips for example made by vapour-depositing aluminium, i.e. four T-shaped conductors the T-shaped conductor 42 connecting the contacts 33 and 38 to metal connection area 43, the T-shaped conductor 44 connecting the contacts 34 and 39 to the metal connection area 45, the T-shaped conductor 46 connecting the contacts 40 and 35 to the metal connection area 47 and the T-shaped conductor 48 connecting the contacts 36 and 37 to the metal connection area 49. The metal connection areas 43, 45, 47 and 49 are also formed by vapour-depositing metal, which may be reinforced in known manner, if desired, with galvanically deposited metal, suitable, for example, for adhering soldering dots 7. The surfaces of the metal connection areas have for this purpose sufficient lateral dimensions. The connection areas 43, 45, 47 and 49 are furthermore provided on the thickened supporting rim 3, so that deformation of the diaphragm 2 during the fixation of the connecting wires 6 with the aid of the soldering dots 7 is avoided.

It should be noted that in the present case the flat sides of the diaphragm are orientated in a (111)-plane. In this orientation the narrow parts 26, 27, 28 and 29 form four resistances, so-called strain gauges, which means that these resistances vary with stresses in the material due to deformations. The strain gauges 26 and 27 are arranged in the proximity of the centre of the diaphragm and the strain gauges 28 and 29 are located nearer the supporting rim 3. As is known in clamped diaphragms the deflection at the centre of the diaphragm will differ from the deflection near the rim 3 in the event of a pressure difference on the diaphragm sides, for example, due to excessive pressure on the side opposite the side of the strain gauges. In the case of an excessive pressure on the side of the diaphragm opposite the sides of the strain gauges the central portion of the diaphragm with the strain gauge 22 and 23 will be convex whereas at the rim 3 the diaphragm with the strain gauges 28 and 29 will be concave. The material of the strain gauges 26 and 27 is thus extended and the material of the strain gauges 28 and 29 is compressed. The resistance of the strain gauges 26 and 27 is thus raised and the resistance of the strain gauges 28 and 29 is decreased. Whereas initially the resistances of the strain gauges are the same, a voltage difference is produced between the connection areas 43 and 47 at the application of a given voltage between the connections 45 and 49, said difference depending upon the pressure difference on the diaphragm sides. It should be noted that in the present case the voltages applied to the contact areas 45 and 49 are not positive to earth in order to avoid electric current paths of some significance across the n-type silicon. It should furthermore be noted that in selecting the voltages to be applied the posibility of break-down of the pn-junctions concerned has to be taken into account. When a bridge voltage of 10 V is used, a pressure difference on the diaphragm varying between 200 and 500 mms Hg produces variation in the measuring voltage of 200 mV. The accuracy of measuring of the pressure difference then has a tolerance of less than 1%. The measuring range concerned is particularly suitable for measuring blood pressure.

It should furthermore be noted that with the known clamped silicon diaphragm the connecting areas are most accurately chosen on the strip location between the convex and the concave diaphragm portions, where extension or compression do practically not occur. Since these connecting places are located on the diaphragm, the manner of connection has to satisfy severe requirements, for example, with respect to flexibility of the connection, whilst the lateral dimensions of the connecting places required for an appropriate connection limit the miniaturisation of the diaphragm size. The provision of the thickened supporting rim 3 in the present case and the possibility of arranging the contact areas on said rim 3 eliminate said disadvantages of known devices.

It is furthermore to be noted that in the embodiment described herein the two sides of the diaphragm are covered throughout with an oxide layer. As an alternative, this oxide layer may be confined to the strain gauges and their immediate neighbourhood and to below the metal conductors, in which case a compensating oxide film on the other side of the diaphragm may be dispensed with. The use of an oxide film on either side of the diaphragm throughout the surface has the advantage that the semiconductor material is better protected from external influences.

Figure 2:
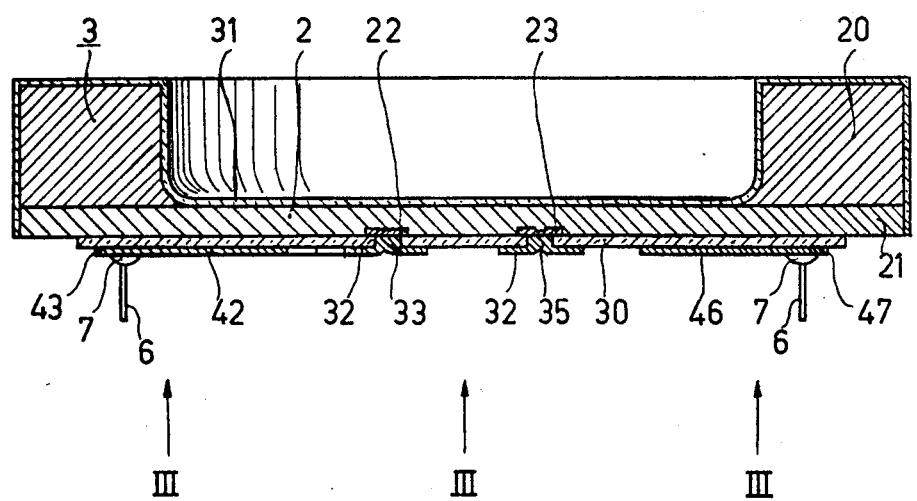
FIG. 2 is a cross sectional view of a silicon diaphragm as used in the device of FIG. 1, and surrounded by a thicker silicon rim.
Figure 3:
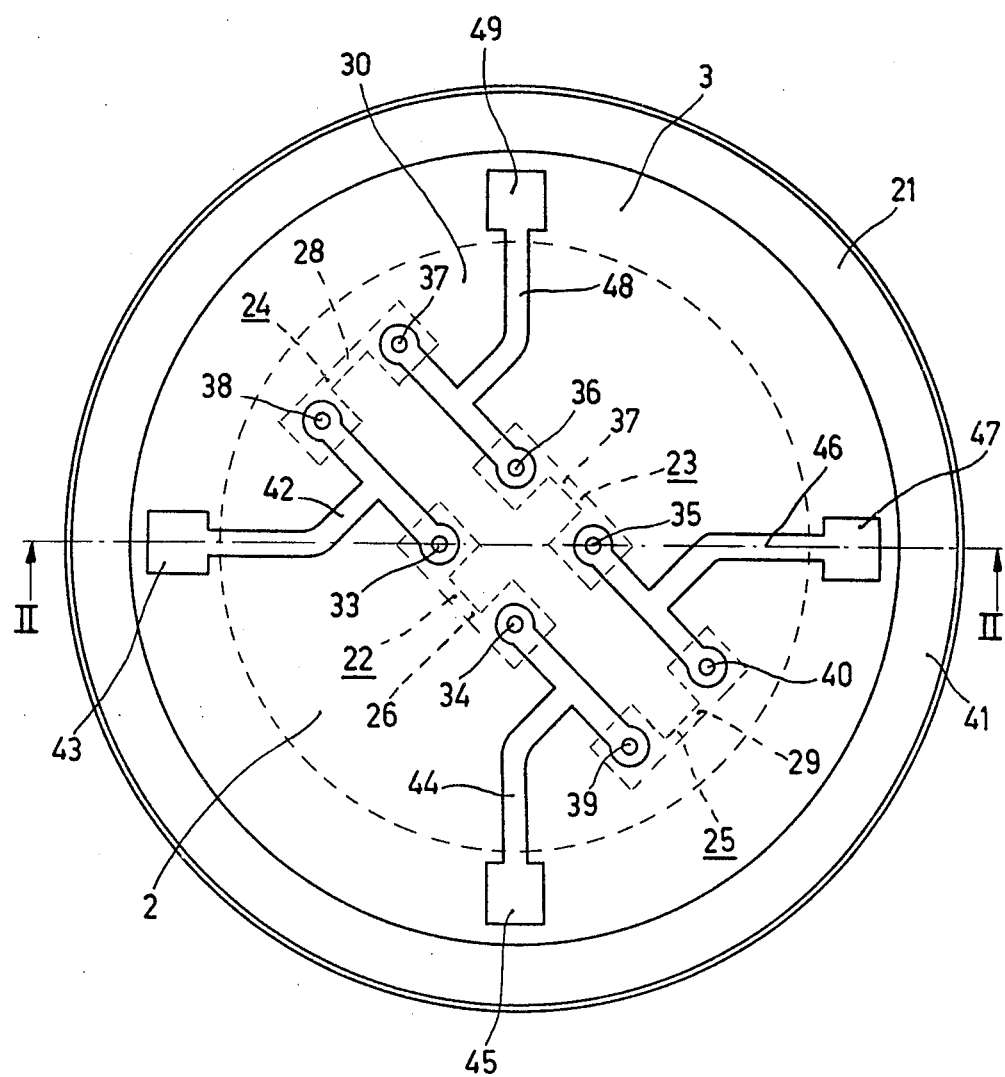
FIG. 3 is a bottom view of the silicon diaphragm of FIG. 2.

In the device shown in FIGS. 2 and 3 the diaphragm 2 is orientated in a (111)-plane. In this case the resistance variation upon deformation is fairly independent of the orientation chosen of the resistance in the (111)-plane.

Figure 4:
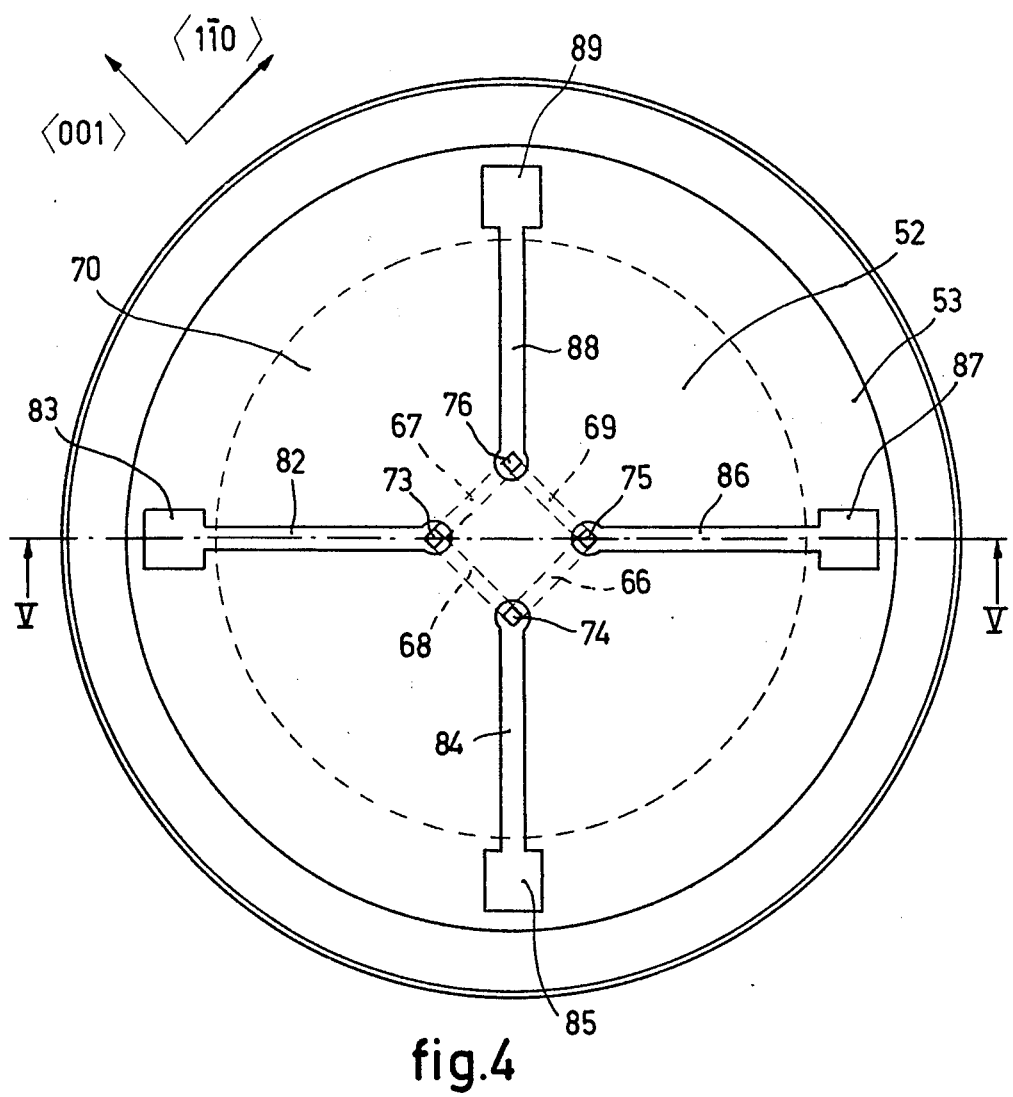
FIGS. 4 and 5 are a bottom view and a cross sectional view respectively of a further silicon diaphragm within a thicker rim suitable for use in a pressure-measuring device.
Figure 5:
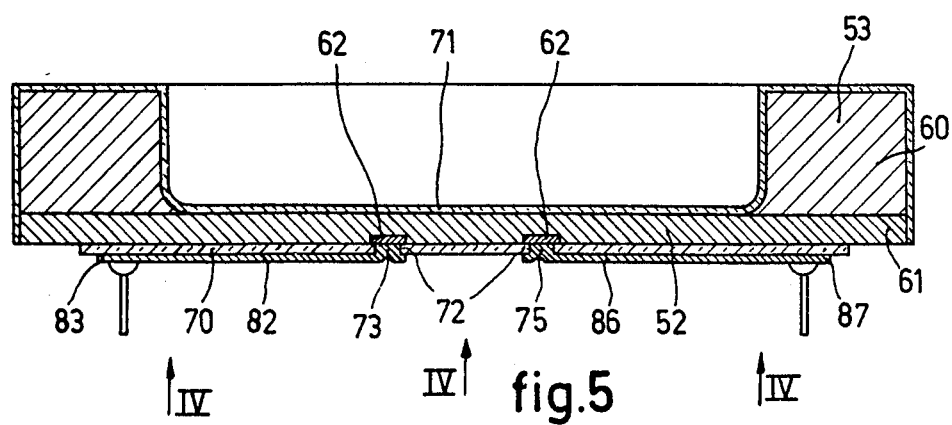

A variant of this device comprising a pressure-sensitive silicon diaphragm in which the crystal orientation is different is shown in FIGS. 4 and 5. The silicon diaphragm 52 and the thickened rim 53 are also made of n-type single-crystal silicon. The dimensions may be similar to those of the silicon body shown in FIGS. 2 and 3). The supporting rim 53 is also formed by an n-type single-crystal silicon substrate 60 of low resistivity, on which an epitaxial layer 61 of n-type silicon of higher resistivity is deposited, said layer being prolonged inside the annular peripheral part 53 and forming the silicon diaphragm 52. The crystal orientation of the silicon is such that the epitaxial layer and the diaphragm are orientated in the (110)-plane of the crystal. In the neighbourhood of the centre four resistance strips of p-type silicon are formed by diffusion, said four resistances 66, 67, 68 and 69 forming together a square around the centre of the diaphragm 52, at the corners of which p-type contacting regions 62 are formed, each of which is located at one end of two of the resistances. The orientation of these resistances is chosen so that the strips 66 and 67 extend in the [1$\bar{1}$0]-direction and the strips 68 and 69 in the [001]-direction. In a manner similar to that described with reference to FIGS. 2 and 3 oxide layers 70 and 71 are applied to either side of the diaphragm, whereas at the area of the contact regions 62 windows 72 are provided in the oxide layer 70. By known techniques, inter alia vapour-deposition of aluminium, the contacts 73, 74, 75 and 76 are provided in the windows and on the oxide layer are provided the contact strips 82, 84, 86 and 88 respectively, connected thereto, and extending to the connection areas 83, 85, 87 and 89 respectively on the rim 53. In this manner a Wheatstone bridge circuit is again obtained, but the resistance strips are now all located near the centre, where in the case of external pressure on the diaphragm all resistance strips are deflected into either a convex or a concave form according as the pressure on the side of the resistance strips is lower or higher respectively than the pressure on the other side. Whereas the resistance strips 66 and 67, extending in the [1Ī0]-direction operate as strain gauges strongly depending upon the deformation of the diaphragm, the p-type conductive strips 68 and 69, extending in the [001]-direction do substantially not vary with deformation of the diaphragm at the area concerned. This low sensitivity of p-type conductive resistances extending in <100>-directions to deflections of the silicon diaphragm is known. If the diaphragm 52 is not deflected, the resistances 66, 67, 68 and 69 are substantially equal. However, when a pressure difference on the diaphragm sides deflects the diaphragm on the side of the resistance strips near these strips into a convex or concave form, the resistances of the strain gauges 66 and 67 will increase or decrease respectively, whereas the resistances of the strain gauges 68 and 69 will practically not vary. When a voltage difference is pplied to the connection areas 85 and 89, a measuring voltage will appear between the connecting areas 83 and 87 in accordance with the pressure difference on the diaphragm sides. The semiconductor device shown in FIGS. 4 and 5 may be arranged in a manner similar to that described above for the semiconductor device of FIGS. 2 and 3 in a measuring apparatus as shown in FIG. 1.

It should be noted that the thickness of the diaphragms shown in FIGS. 2 to 5 may be adapted to the desired pressure range. With a large pressure range a comparatively large thickness and with a small pressure range a small thickness of the diaphragm is preferred, the lateral dimensions of the diaphragm being the same. For measuring the same pressure range the thickness of the diaphragm is preferably reduced, when the lateral dimensions are reduced.

Figure 6:
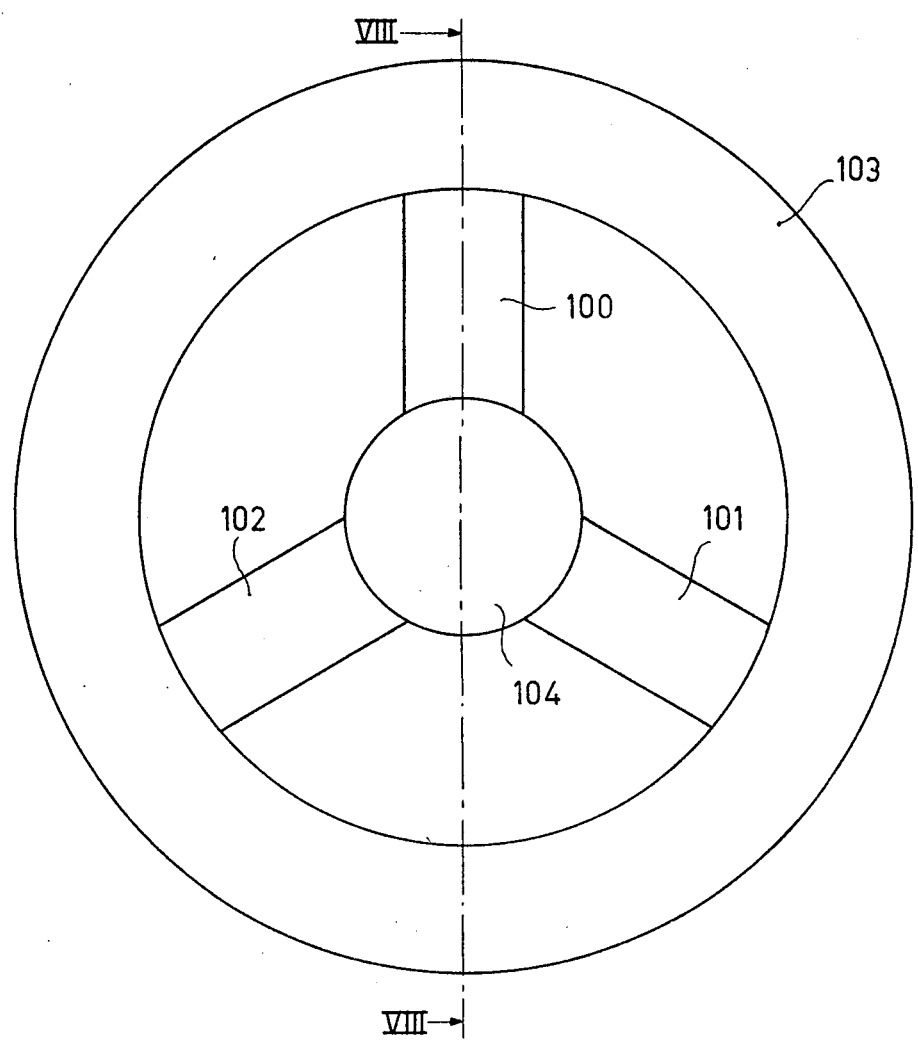
FIGS. 6, 7 and 8 illustrate a semiconductor device for converting mechanical stresses into electric signals suitable, for example, for measuring accelerations and comprising thinner and thicker parts.
Figure 7:
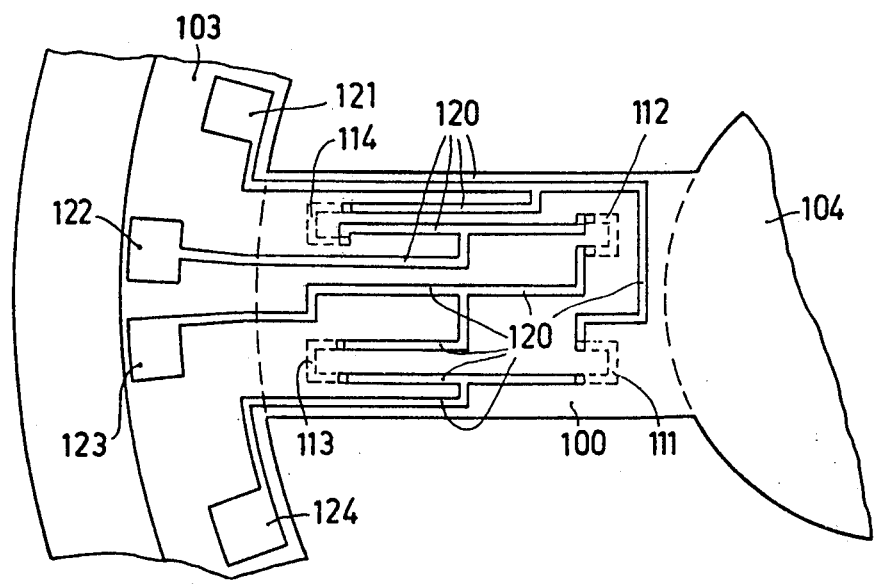
Figure 8:
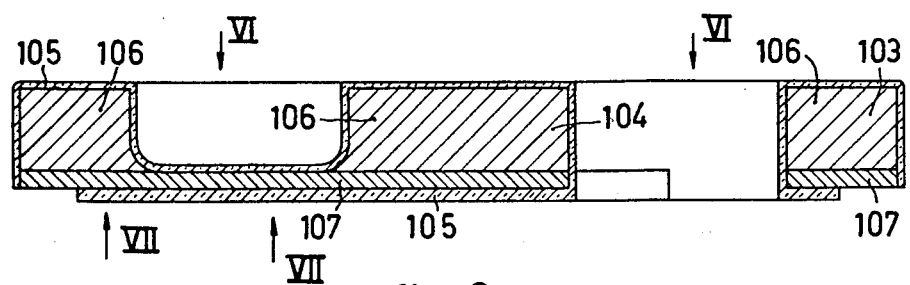

FIGS. 6, 7 and 8 show devices for converting mechanical stresses into electric signals, in which flat bending springs of semiconductor material in the form of strips are used, which connect a thickened supporting rim with a thickened central portion. Such devices may be used as accelerometers, in which the thickened rim is rigidly connected with the object, for example a vehicle, a rocket, whereas the central portion operates as an inertia mass or conversely. In this way accelerations or decelerations can be measured at right angles to the planes of the bending springs. The semiconductor device shown in FIGS. 6, 7 and 8 comprises a thick, circular supporting rim 103, a thick disc-shaped central portion 104 and strip-shaped flat deflection springs 100, 101 and 102, which form the sole mechanical connection between the rim 103 and the central portion 104. These springs have the shape of strips with equal thicknesses, which are small with respect to the thickness of the rim 103 and of the central portion 104. The two thicker portions are preferably made of single-crystal substrate material 106, for example, low-ohmic n-type silicon, the crystal orientation of the substrate material of the rim 103 corresponding with the orientation of the substrate material of the thickened central portion 104. The substrate material has an epitaxial layer 107 of n-type silicon having a resistivity of more than 0.1 Ohm.cm, extending on one side over the substrate material of the portions 103 and 104 and forming, in addition, the bending springs 100, 101 and 102. The body is provided on either side throughout or substantially throughout its surface with an oxide layer 105. The epitaxial layer is orientated in a {111}-plane. The bending springs 100, 101 and 102 comprise each four strain gauges, the ends of which are interconnected in the manner shown in FIG. 2 in accordance with a Wheatstone bridge circuit, whilst they are furthermore connected to connection areas provided either on the rim 103 or on the central portion 104 according as the rim or the central portion is rigidly secured to the object whose acceleration or deceleration has to be measured. For the sake of clarity these strain gauges with the conductive connecting strips and connection areas are not shown in FIG. 8, but they are shown on an enlarged scale in FIG. 7 for the strain gauges in the bending spring 100. The strain gauges 111, 112, 113 and 114 of p-type silicon are obtained by the diffusion of an acceptor, for example, boron. At their ends they are connected through windows in the oxide layer 105 (not shown) by means of aluminium strips 120 to each other and arranged with the connecting places on the rim 121, 122, 123 and 124 of aluminium in a Wheatstone bridge circuit. The strain gauges 111 and 112 are located near the thickened central portion 104 and the strain gauges 113 and 114 are located nearer the thickened rim 103. In the case of an axial displacement of the central portion 104 relative to the rim 103 the bending spring 100 is deformed so that the bend near the central portion is opposite the bend near the peripheral part. As described above with reference to the semiconductor device of FIGS. 2 and 3 the two resistances 111 and 112 will vary in a sense opposite to that of the resistances 113 and 114. Said displacement is produced in the present case by an acceleration or a deceleration in directions transverse of the plane of the spring, whilst owing to the inertia of the mass of the central portion 104 and of any reinforcements thereof the extent of deflection of the flat springs will occur depending upon the acceleration or the deceleration. When a fixed voltage is applied to the connecting places 121 and 123, a measuring voltage depending upon the acceleration or the deceleration will appear between the connecting places 122 and 124. It is preferred to determine simultaneously measuring voltages of similar strain gauges included in Wheatstone bridge circuits of the bending springs 101 and 102 in order to permit of assessing unequal deflections of these three flat springs, which can be taken into account in determining the axial acceleration or deceleration.

Also the device shown in FIGS. 6, 7 and 8 may have comparatively small dimensions, for example, a central portion of a diameter of about 1 to 2 mms, flat bending springs of a length of about 1 mm and a supporting rim having a difference between the inner diameter and the outer diameter of about 0.5 to 1 mm.

Instead of being used as an accelerometer the device shown in FIGS. 6, 7 and 8 may be used for other measurements, for example, that of the radius of curvature of surfaces, particularly surfaces of small width, in which case the thick parts 103 and 104 are urged by the side opposite the epitaxial layer 107 against the surface concerned. It is furthermore possible to measure very small displacements of objects, for example, by connecting the central portion 104 with said object. It is furthermore not excluded to convert in this manner mechanical vibrations into electric oscillations.

In the examples shown herein strain gauges of p-type silicon are employed in n-type material. In principle, strain gauges of n-type material may be used in p-type material. The resistances of strain gauges of n-type silicon increase in the event of compression and decrease in the event of extension. In general, however, p-type strain gauges are more sensitive than n-type strain gauges. It should furthermore be noted that whereas with a flat bending spring of silicon orientated in a {110}-plane the resistance of strain gauges of p-type silicon in a <100>-direction does not markedly change, when the spring is deflected, such as resistance variation does occur in a flat bending spring of said orientation in a strain gauge of n-type silicon extending in said direction.

Now the method according to the invention for manufacturing semiconductor devices comprising adjacent parts, at least one of which is thicker than at least one adjacent part, will be discussed, which method is particularly suitable for the manufacture of semiconductor devices for converting mechanical stresses into electric signals of the type described above. Details of an embodiment of each method to be described hereinafter relates to the manufacture of the semiconductor device described with reference to FIGS. 2 and 3, a great number of which is made from a single disc of single-crystal silicon.

The manufacture starts from a disc-shaped body of n-type single-crystal silicon of a resistivity of 0.01 Ohm. cm, having a diameter of about 35 mms and a thickness of about 250$\mu$. The two flat sides are orientated in a {111} crystal plane. The disc-shaped body may be obtained in known manner from a single-crystal bar of said material, for example obtained by pulling from a silicon melt doped with antimony.

An epitaxial layer is deposited on one of the flat sides of the disc-shaped body. For this purpose the surface on that side is previously polished, then etched in gaseous hydrochloric acid mixed with hydrogen and than fired at a temperature of about 1100° C. In known manner an epitaxial layer is applied to the surface concerned, the silicon substrate material for the epitaxial layer being heated at 1050° and a gas mixture of silicon tetrachloride and hydrogen with a small addition of phosphoroxychloride being led in known manner across the heated substrate. As epitaxial layer of n-type silicon of a resistivity of 0.6 Ohm.cm is deposited. The epitaxial deposition process is terminated after 15 minutes. An epitaxial layer of a thickness of 15$\mu$ consisting of single-crystal n-type silicon of a specific resistivity of 0.6 Ohm.cm is then formed. On the disc a silica film is formed by heating the disc at 1100° C. in wet oxygen, after which by a known photoresist technique windows are locally etched in the oxide film for obtaining the p-type conductive zones 22, 23, 24 and 25 of p-type silicon by boron diffusion. After diffusion the oxide film is removed and a fresh oxide film is formed by again baking in wet oxygen at 1100° C. By known photoresist methods the windows 32 are etched in the oxide film (see FIG. 2) and the pattern of vapour-deposited aluminium shown in FIG. 3 is formed in known manner in order to obtain the contacts 33, 34, 35, 36, 37, 38, 39, 40 in the windows 32, the connection areas 43, 45, 47 and 49 and the T-shaped conductive paths 42, 44, 46 and 48. As usual the pattern of p-type zones of aluminium shown in FIG. 3 is repeated throughout the epitaxial layer of the disc.

Figure 9:
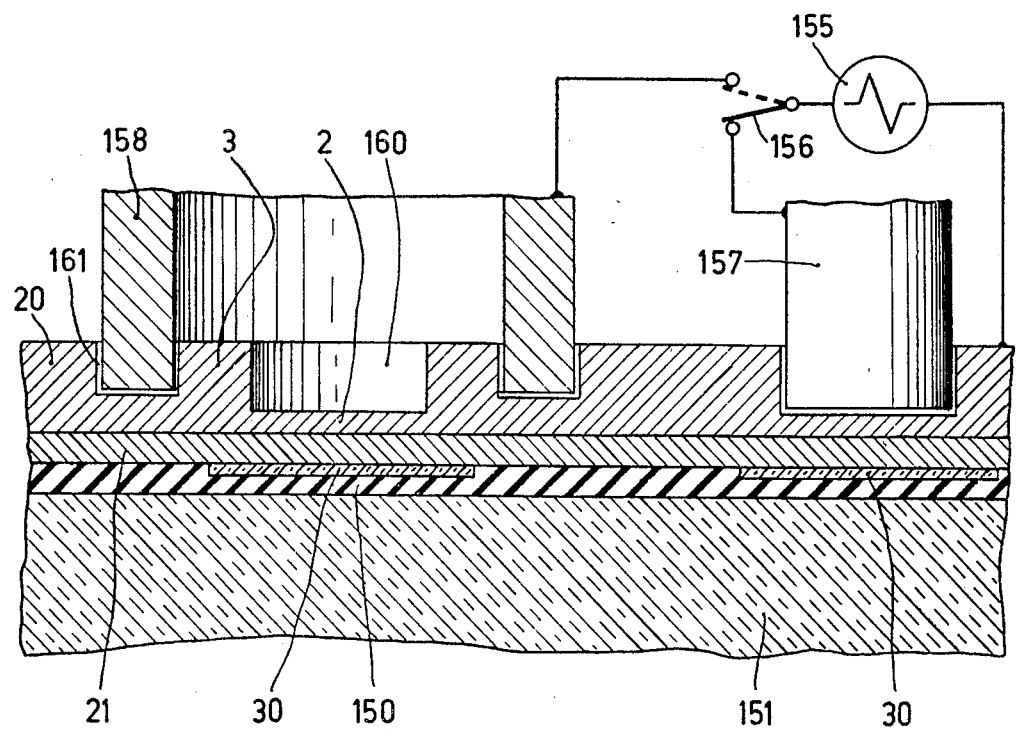
FIGS. 9 and 10 are diagrammatical vertical sectional views in stages of the manufacture of semiconductor devices having thicker and thinner semiconductor parts.
Figure 10:
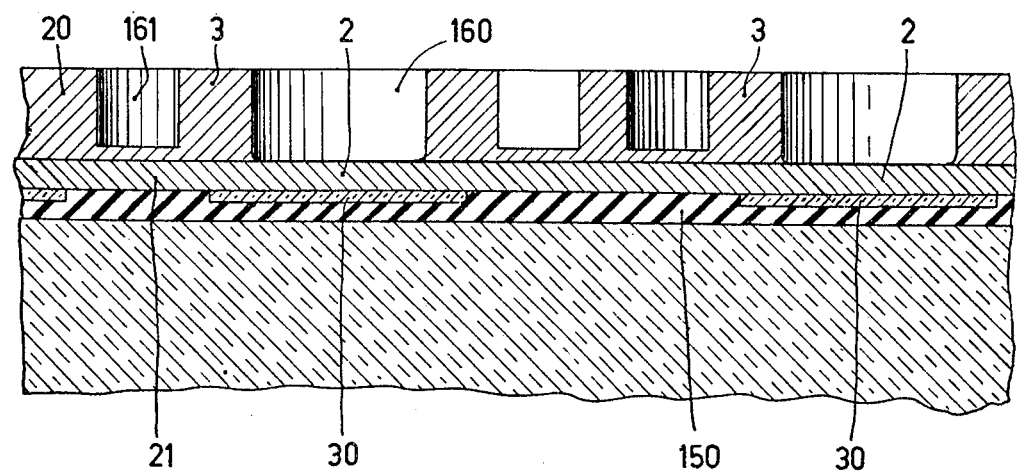

The disc is then stuck by the side of the epitaxial layer with the aid of a suitable adhesive 150, for example, Canada balsam, to a glass plate 151 (see FIG. 9). For making the diaphragm inside the thick rim material has to be removed locally from the side opposite the epitaxial layer down to the epitaxial layer. It is furthermore desirable to provide grooves which determine the outer periphery of the thickened rim. For this purpose the silicon is removed by spark erosion as is described with reference to FIG. 9. To the places where material has to be removed to form the diaphragm a spark erosion electrode of cylindrical shape having a flat bottom side and having a diameter of 1 mm is applied. Furthermore an electrode 158 of tubular shape with an innerdiameter of about 1.6 mms and an outer diameter of about 2 mms is used. Through a switch the electrodes 157 and 158 can be alternately connected to the terminal of a pulse generator, the other terminal of which is connected to the silicon disc. The assembly is arranged in deionized water and the pulse generator 155 produces current pulses with voltage peaks of 100 V and a frequency of 10,000 Hz at the place where the diaphragm has to be made. The electrode 157 is disposed at a distance of a few microns from the free surface of the silicon disc, after which by means of a switch 156 the pulse voltage source is connected so that eroding sparks are struck between the silicon and the electrode 157. The eroding effect extends up to a distance of a 4$\mu$ from the surface of the electrode 157. During the erosion the electrode 157 is moved very slowly downwards so that a cavity with accurately orientated sidewalls is formed, into which the electrode 157 is allowed to penetrate gradually further according as the cavity 160 becomes deeper. The spark erosion is continued until the cavity 160 is still separated by about 10$\mu$ from the epitaxial layer 21. Subsequently the electrode 157 is set to a further place where a diaphragm has to be formed. The tubular electrode 158 is then positioned near the free surface of the disc 3 coaxially to the cavity 160 formed. By means of the switch 156 the electrode 158 is then connected to the pulse generator and in the manner used for making the cylindrical cavity 160 with the aid of the electrode 157 an annular groove 161 is made, which is also deepened by a progressive insertion of the electrode 158. To spark erosion by the electrode 158 is continued until the bottom of the groove 161 is at a distance of about 25$\mu$ from the epitaxial layer 21. In this manner a very accurate shape of the diaphragms 2 and of the rims 3 is obtained. The bottom of the cavity 160 may still have irregularities. For deepening the cavity 160 further to form diaphragms 2 of uniform thickness a selective electrolytic etching process is used as described in Dutch Patent Application Nr. 6,703,013. An electrode connection is locally established on the substrate material 20, for example, a platinum electrode. The assembly is immersed in an aqueous HF solution obtained by mixing 1 part by volume of concentrated hydrofluoric acid (50% by weight) with 10 parts by volume of water. The platinum contact then receives an anodic bias voltage relative to a platinum electrode immersed in a bath, the value being 12 V. The substrate material is then dissolved at a rate of about 2$\mu$ a minute. After 6 minutes the electrolytic etching process is already accomplished. Owing to the short duration of this etching process the lateral dimensions of the cavities 160 are widened only slightly. The n-type silicon at the bottom of the cavities 160 is anodically dissolved until the epitaxial layer 21 of higher resistivity is reached. As soon as this limit is attained, the etching process terminates locally so that any epitaxial layer of uniform thickness is left as a diaphragm (see FIG. 10). Since the annular grooves 161 are made less deep than the cavities 160, a good conducting connection of the whole substrate material 3 with the platinum contact on the substrate material is ensured during the etching process until the cavities 160 have reached the epitaxial layer over the whole bottom. The resultant flat bottom forms a slightly rounded-off corner with the sidewalls of the cavities, which is advantageous with semiconductor devices used for converting mechanical stresses into electric signals. Within the time of 6 minutes the grooves 161 appear not to have reached the epitaxial layer. As will be seen from FIG. 10, the diaphragms 2 with the thickened rims 3 are already formed. The various diaphragms 2 with the associated rims 3 can then be covered in known manner by a resist and the groove 161 can be depened further by a chemical etchant, the epitaxial layer 21 being also locally removed, whilst the pressure-sensitive semiconductor devices are separated from each other. Subsequently the resultant semiconductor devices are removed from the support by dissolving the Canada balsam in known manner.

The resultant semiconductor bodies need then only be provided with the oxide layer 31, preferably by a method that can be carried out at a comparatively low temperature (see FIG. 2). Then by a conventional etching process the oxide layer can be removed at the edge from the external part of the surface of the epitaxial layer, where a metal layer may be applied.

It is clear that a similar method may be applied for manufacturing semiconductor devices of the type as described with reference to FIGS. 4 and 5.

It should be noted that it is of course possible to provide openings in the diaphragm by removing parts of the epitaxial layer prior to the local removal of the substrate material by spark erosion. As an alternative, by diffusion, for example, low-ohmic p-type or n-type regions extending down into the substrate material may be provided in the eptaxial layer, said local, low-ohmic regions being also removed during the selective electrolytic etching process so that openings are obtained. These methods may be used for obtaining the openings between the flat bending springs in the device described with reference to FIGS. 6, 7 and 8. A cylindrical spark electrode having a central boring for saving the material of the thickened central portion 104 may be used in the local removal step of the substrate material by spark erosion.

As a further alternative an epitaxial layer of high-ohmic p-type material and the selective electrolytic etching process may be used so that during the application of the epitaxial layer at a comparatively high temperature a very thin zone of high-ohmic n-type material is formed by diffusion between the low-ohmic n-type material and the high-ohmic p-type material, which zone arrests the selective electrolytic etching process.

What is claimed is:

1. A method of manufacturing a semiconductor device comprising the steps of providing a plate-shaped semiconductor body of one conductivity type, forming a substantially continuous layer of semiconductor material of opposite conductivity type on a flat side of said body, forming at least one circuit element in said layer, providing electrical contacts to said circuit element, removing by spark erosion a first portion of the semiconductor body opposite said layer and short of said layer and then using a selective etching process to remove a second portion of the semiconductor body down to said layer.

* * * * *